(12) United States Patent
Zhang

(10) Patent No.: US 10,917,975 B2
(45) Date of Patent: Feb. 9, 2021

(54) VERTICAL CIRCUIT BOARD PRINTER

(71) Applicant: SHENZHEN JINGJIANG YUNCHUANG TECHNOLOGY CO., LTD., Shenzhen (CN)

(72) Inventor: Xue-Qin Zhang, Shenzhen (CN)

(73) Assignee: Shenzhen Jingjiang Yunchuang Technology Co., Ltd., Shenzhen (CN)

( * ) Notice: Subject to any disclaimer, the term of this patent is extended or adjusted under 35 U.S.C. 154(b) by 337 days.

(21) Appl. No.: 16/015,508

(22) Filed: Jun. 22, 2018

(65) Prior Publication Data

US 2019/0357359 A1 Nov. 21, 2019

(30) Foreign Application Priority Data

May 18, 2018 (CN) .......................... 2018 1 0482648

(51) Int. Cl.
*H05K 3/12* (2006.01)
*H05K 1/02* (2006.01)
(Continued)

(52) U.S. Cl.
CPC ............. *H05K 3/12* (2013.01); *H05K 1/0266* (2013.01); *H05K 3/0026* (2013.01); *H05K 3/0047* (2013.01); *H05K 3/0085* (2013.01); *H05K 3/28* (2013.01); *H05K 13/0061* (2013.01); *H05K 2201/09936* (2013.01);
(Continued)

(58) Field of Classification Search
CPC .. H05K 3/0011; H05K 3/0026; H05K 3/0047; H05K 3/0058; H05K 3/0085; H05K 3/0091; H05K 3/0097; H05K 3/12; H05K 3/1241; H05K 3/125; H05K 3/28; H05K 3/4611; H05K 13/0061; H05K 2203/013; H05K 2203/0165; H05K 2203/0195; H05K 2203/0257; H05K 2203/06; H05K 2203/107; H05K 2203/15; H05K 2203/1509; H05K 2203/1518; H05K 2203/1536; H05K 2203/1545; H05K 2203/1554; H05K 2203/1563;
(Continued)

(56) References Cited

U.S. PATENT DOCUMENTS

| 5,462,599 A * | 10/1995 | Kuster ................. H05K 3/0091 118/503 |
| 7,617,774 B2 * | 11/2009 | Walther ........... G06K 19/07749 101/183 |
| 2008/0184557 A1 * | 8/2008 | Park ..................... H05K 13/085 29/840 |

FOREIGN PATENT DOCUMENTS

| CN | 201553319 U | 8/2010 |
| CN | 106494098 A | 3/2017 |

(Continued)

*Primary Examiner* — Peter Dungba Vo
*Assistant Examiner* — Joshua D Anderson
(74) *Attorney, Agent, or Firm* — ScienBiziP, P.C.

(57) ABSTRACT

A vertical circuit board printer includes a multi-layer conveyor, a printer assembly, and a control system. The multi-layer conveyor includes a number of front conveyors and one rear conveyor. Each upper front conveyor is coupled to a lower front conveyor by a circuit board-lowering mechanism to transport a number of circuit boards in sequence from the number of front conveyors to the rear conveyor. The printer assembly includes a number of printers arranged in sequence above the number of front conveyors. The control system controls operation of the multi-layer conveyor and controls operation of the printing assembly through a software system.

11 Claims, 9 Drawing Sheets

(51) Int. Cl.
  H05K 3/00     (2006.01)
  H05K 3/28     (2006.01)
  H05K 13/00    (2006.01)

(52) U.S. Cl.
  CPC ............... *H05K 2203/0165* (2013.01); *H05K 2203/0195* (2013.01); *H05K 2203/0257* (2013.01); *H05K 2203/107* (2013.01); *H05K 2203/1509* (2013.01); *H05K 2203/1581* (2013.01); *Y10T 29/49155* (2015.01)

(58) Field of Classification Search
  CPC .... H05K 2203/1572; H05K 2203/1581; Y10T 29/49155; Y10T 29/5196; Y10T 29/53187
  See application file for complete search history.

(56) References Cited

FOREIGN PATENT DOCUMENTS

| | | |
|---|---|---|
| CN | 106696475   | 5/2017 |
| CN | 106696475 A | 5/2017 |
| TW | M363182     | 8/2009 |
| TW | 201607773   | 3/2016 |

* cited by examiner

VERTICAL CIRCUIT BOARD PRINTER

FIELD

The subject matter herein generally relates to printed circuit boards, and more particularly to a vertical circuit board printer.

BACKGROUND

Generally, printed circuit boards require much machinery and many processes to finish being printed. The machinery takes up lots of space, and the process may take a long time.

BRIEF DESCRIPTION OF THE DRAWINGS

Implementations of the present disclosure will now be described, by way of example only, with reference to the attached figures.

DETAILED DESCRIPTION

Figure 1:
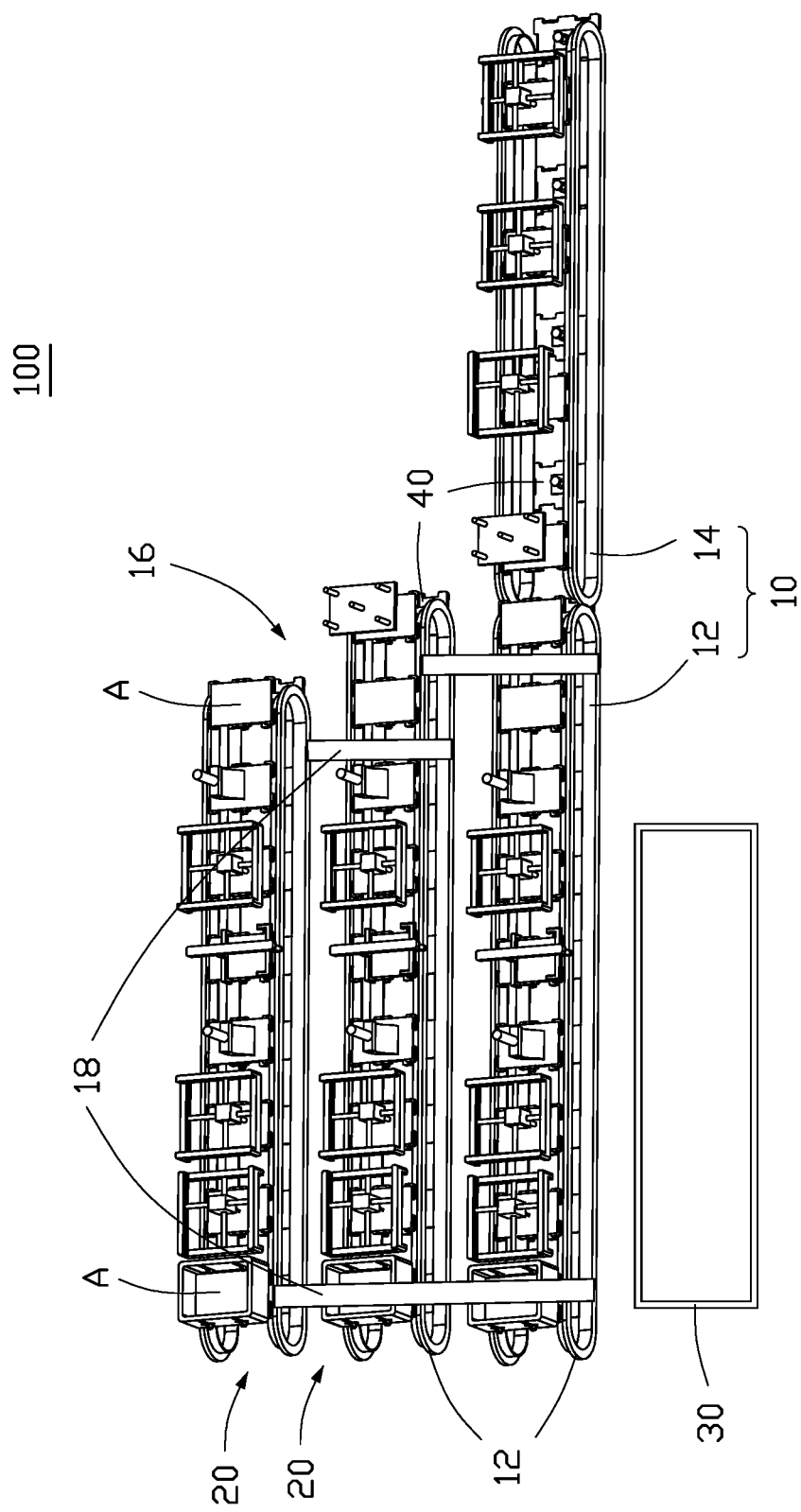
FIG. 1 is a view of an exemplary embodiment of a vertical circuit board printer in accordance with an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 illustrates an embodiment of a vertical circuit board printer 100 including a multi-layer conveyor 10, a printer assembly 20, and a control system 30. The multi-layer conveyor 10 includes a plurality of front conveyors 12 and one rear conveyor 14. A circuit board-lowering mechanism 16 is located between adjacent upper and lower front conveyors 12 to transport circuit boards A transported by the front conveyors 12 to the rear conveyor 14 in sequence. In at least one embodiment, the circuit board-lowering mechanism 16 is located at an end of the corresponding front conveyor 12 facing the rear conveyor 14. The circuit board A is transported from an upper front conveyor 12 to an adjacent lower front conveyor 12 through corresponding positions between the adjacent upper and lower front conveyors 12. In at least one embodiment, the front conveyors 12 are stacked on top of each other and supported by load-bearing brackets 18. The printer assembly 20 is located above each front conveyor 12, so that the vertical circuit board printer 100 occupies less space. In addition, a quantity of the front conveyors 12 is determined according to a manufacturing requirement of the circuit board A. In at least one embodiment, there are three front conveyors 12. Furthermore, a width of the front conveyors 12 and of the rear conveyor 14 is determined according to a size of the circuit board A. Furthermore, the rear conveyor 14 is coupled to the bottom-most front conveyor 12. Thus, the circuit board A is transported in sequence by the front conveyors 12 to the bottom-most front conveyor 12, and then transported to the rear conveyor 14, thereby achieving transport of the circuit board A on the multi-layer conveyor 10.

Figure 2:
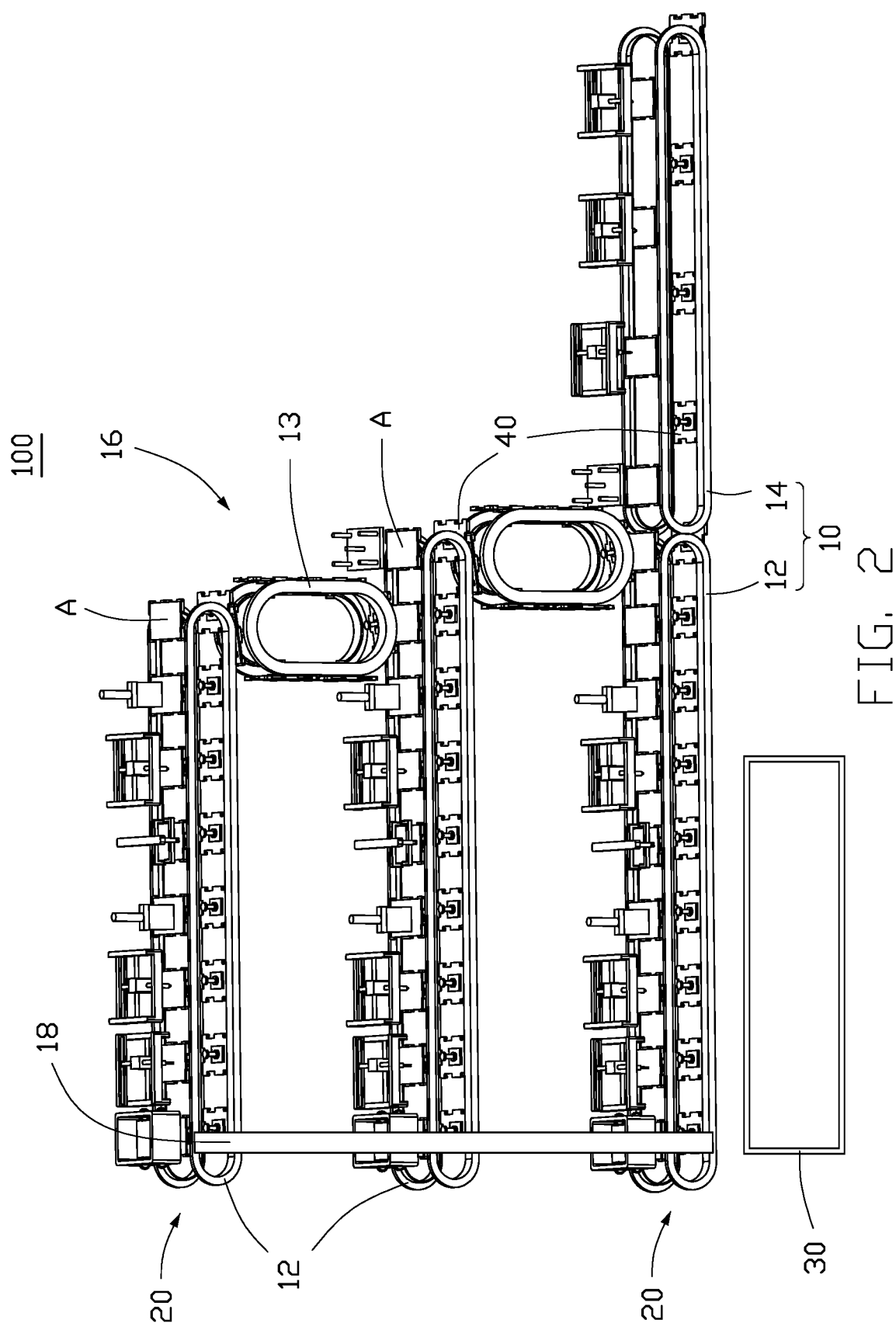
FIG. 2 is a view of another embodiment of the vertical circuit board printer in FIG. 1.

FIG. 2 illustrates another embodiment of the vertical circuit board printer 100. In FIG. 1, the circuit board-lowering mechanism 16 is vertical-lowering mechanism. In FIG. 2, the circuit board-lowering mechanism 16 is a conveyor belt 13 located at the end of the front conveyor 12 facing the rear conveyor 14. The circuit board-lowering mechanism 16 is located between each adjacent upper and lower front conveyors 12 to transport the circuit board A from the upper front conveyor 12 to the lower front conveyor 12.

Figure 3:
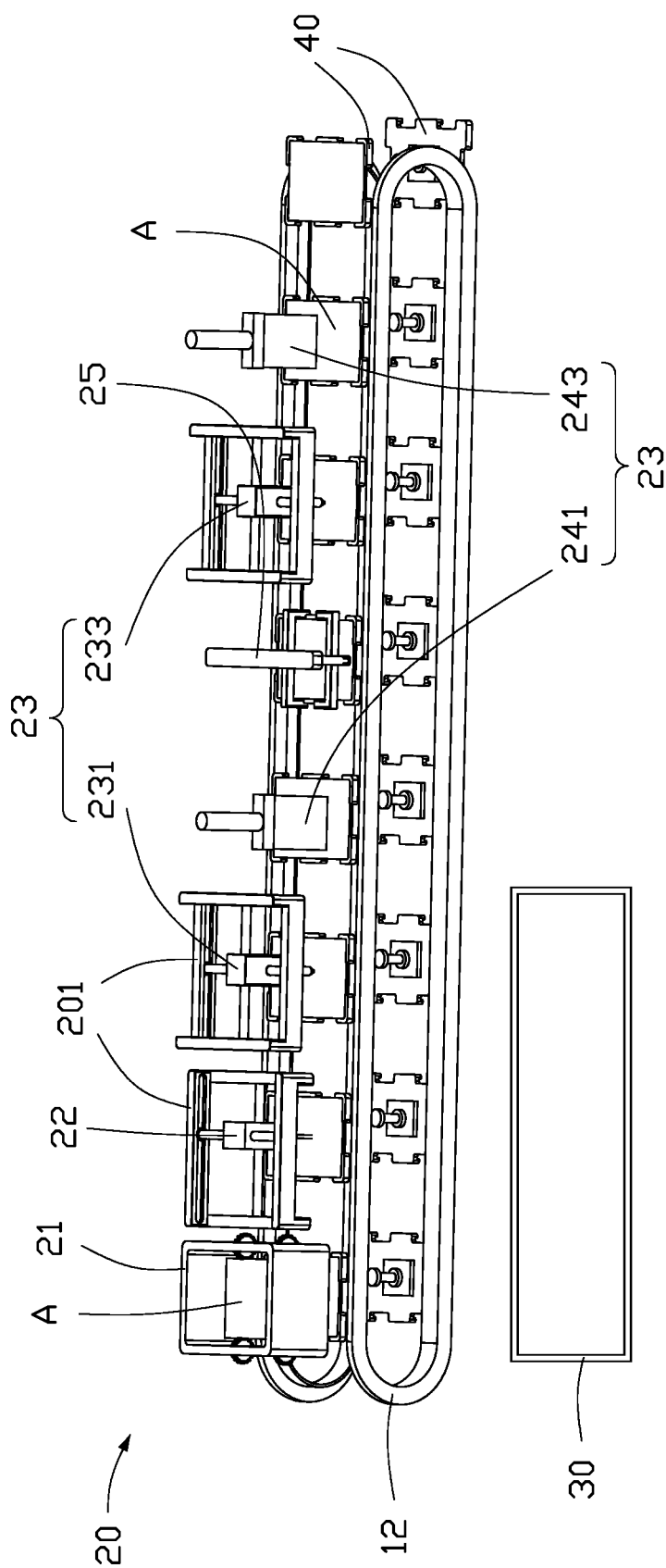
FIG. 3 is a view of a front conveyor of the vertical circuit board printer in FIG. 1.

Referring to FIG. 3, each front conveyor 12 is substantially the same. Each front conveyor 12 includes a plurality of trays 40 equally spaced apart on the front conveyor 12. Each tray 40 is capable of retracting to hold the circuit board A or release the circuit board A. Movement of the trays 40 on the front conveyor 12 is controlled by the control system 30 (shown in FIG. 1). The control system 30 controls the front conveyor 12 according to a plurality of sensors (not shown). For example, the front conveyor 12 is driven by a driving device, such as a step motor, to move the trays 40 cyclically on the front conveyor 12. The sensors of the control system 30 include a material sensor and a position sensor. The material sensor is located on the tray 40 and is used for sensing material within the tray 40 and retracts the tray 40 to hold or release the material within the tray 40. The position sensor is located between the front conveyor 12 and the tray 40. The position sensor is fixed in position between the front conveyor 12 and the tray 40. The position sensor is located on the tray 40 and moves along with the tray 40. The position sensor confirms a position of the tray 40 on the front conveyor 12 through radio frequency identification (RFID).

Thus, the control system 30 can accurately control the position of the tray 40 on the front conveyor 12 and in relation to printers of the printer assembly 30 and control the tray 40 to hold or release the circuit board A. The trays 40 on the rear conveyor 14 can be controlled by the control system 30 according to the method described above. Such control technology is known in the art and will not be described in further detail here. Furthermore, the printer assembly 20 located above the front conveyor 12 includes a plurality of printing devices equally spaced apart and facing the trays 40. The plurality of printing devices include a feeding device 21, a punching device 22, at least one circuit printing device 23, at least one insulating adhesive brush 24, and a flipping device 25. In at least one embodiment, the printing devices of the printer assembly 20 are arranged according to a circuit board manufacturing process. For example, if the circuit board A needs to be printed on both sides, the printing device above the front conveyor 12 include in sequence, from an end of the front conveyor 12 away from the rear conveyor 14 to the rear conveyor 14, the feeding device 21, the punching device 22, a first circuit printing device 231, a first insulating adhesive brush 241, a flipping device 25, a second circuit printing device 233, and a second insulating adhesive brush 243.

Figure 4:
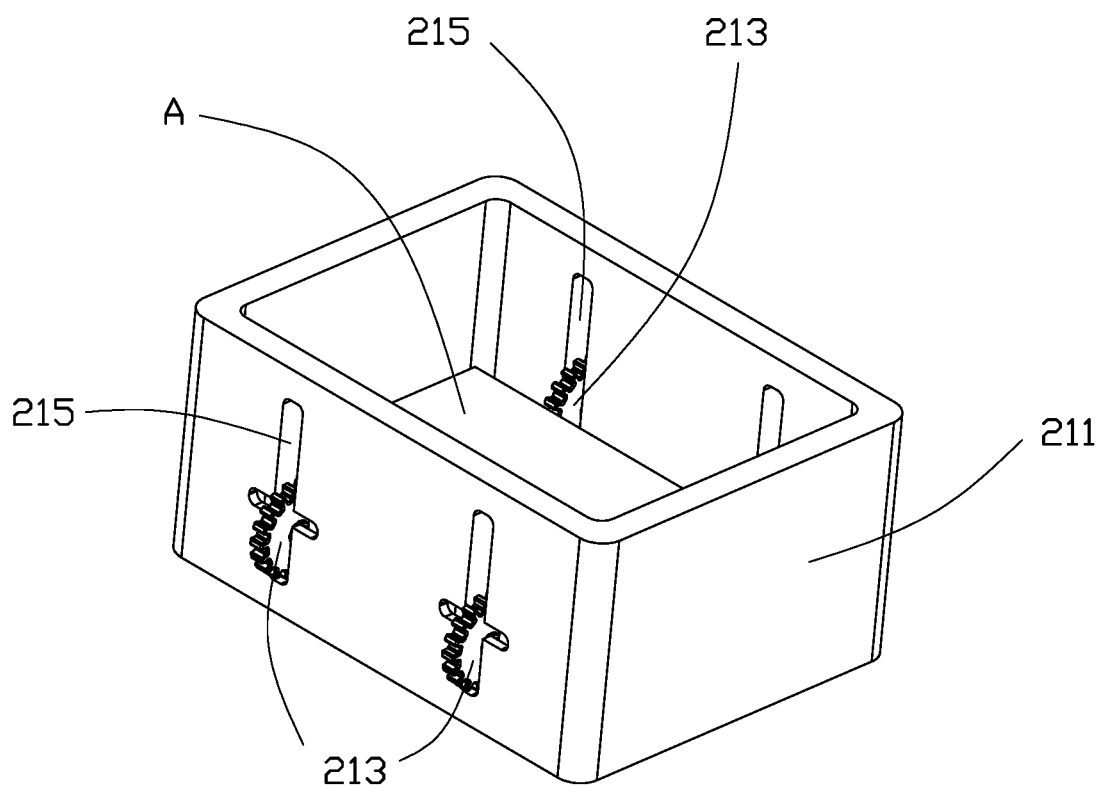
FIG. 4 is a view of a feeding device of the vertical circuit board printer in FIG. 3.

Referring to FIG. 4, the feeding device 21 includes a feeding box 211 and a plurality of gears 213. A top and bottom side of the feeding box 211 are open. The plurality of gears 213 are located on side surfaces of the feeding box 211. The printed circuit board A is supported by teeth grooves of the gears 213. A size of the teeth grooves of the gears 213 is determined according to a thickness of the circuit board A. In at least one embodiment, there are four gears 213 arranged in two gear groups. Each gear group is made up of two gears 213 synchronously coupled together. The two gear groups are located on corresponding opposite sidewalls of the feeding box 211 at a same height of the sidewalls, so that the two gear groups positioned at the same height can support the printed circuit board in a horizontal plane. Thus, when the two gear groups synchronously rotate a tooth distance, the horizontally supported circuit board A is lowered toward the corresponding tray 40 (shown in FIG. 3). Thus, the circuit board A is lowered through the bottom opening of the feeding box 211 onto the corresponding tray 40. Furthermore, to maintain the horizontal orientation of the circuit board A supported by the gear groups, each gear group is located on a corresponding standard scale guide rail 215 on the sidewall of the feeding box 211, so that the two gear groups are positioned at a same height. Thus, a position of the gears 213 is confirmed according to the standard scale, thereby confirming a shape and size of the circuit board A.

Figure 5:
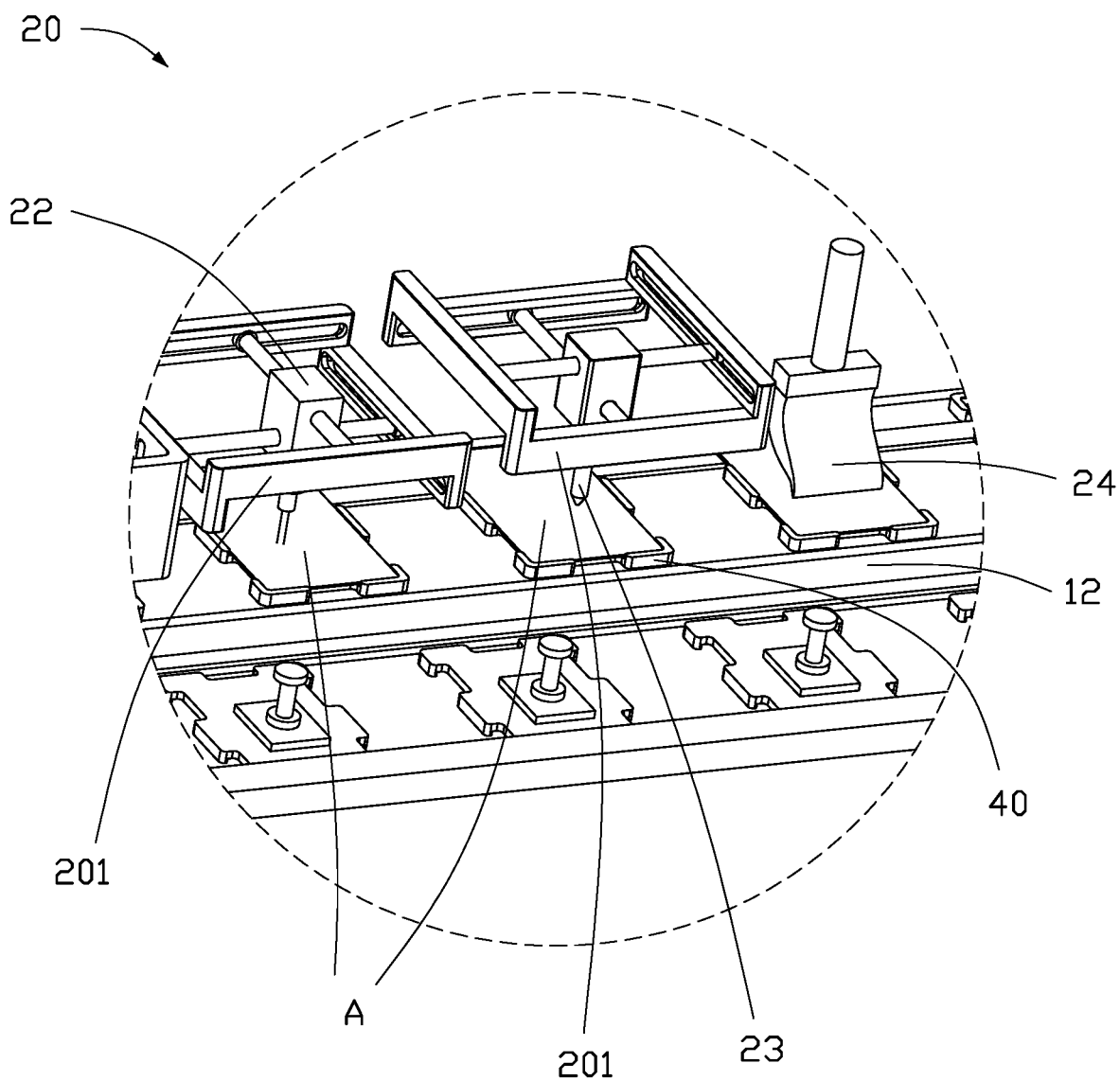
FIG. 5 is a view of a punching device of the vertical circuit board printer in FIG. 3.

Referring to FIG. 5, the punching device 22, the first circuit printing device 231, and the second circuit printing device 233 (as shown in FIG. 3, the first circuit printing device 231 and the second circuit printing device 233 are referred to as "the circuit printing device 23) are fixed on a guiding device 201. A drilling machine (not labeled) of the punching device 22 and a print head of the circuit printing device 23 are located on the guiding device 201. The guiding device 201 guides operation of the drilling machine of the punching device 22 and the print head of the circuit printing device 23. The drilling machine and the print head are movable along an X-axis and Y-axis direction in a horizontal plane. The drilling machine of the punching device 22 may use a laser drilling head or a mechanical drilling head and includes a plurality of drilling heads having different diameters for drilling holes of different diameters in the circuit board A. For example, the mechanical drilling head may include five or six drilling heads having different diameters, such as 0.5 mm, 0.6 mm, 0.7 mm, 0.8 mm, 1 mm, 1.5 mm, 2 mm, 3 mm, for example, for drilling holes of different sizes according to requirements of the circuit board A. Furthermore, the guiding device 201 guides movement of the circuit printing device 23. For example, after the circuit board A is finished being punched, the circuit board A is moved along the front conveyor 12 to the first circuit printing device 231, and then to the subsequent printing devices during the process of printing the circuit board A. In at least one embodiment, the print head includes a plurality of print nozzles having different diameters, such as 0.5 mm, 0.6 mm, 0.7 mm, 0.8 mm, 1 mm, 1.5 mm, 2 mm, 3 mm, for example, for printing the circuit according to requirements of the circuit board A. In addition, the first circuit printing device 231 prints a circuit on an upper surface of the circuit board A, and the second circuit printing device 233 prints a circuit on a lower surface of the circuit board A. In at least one embodiment, material used by the circuit printing device 23 for printing the circuit is conductive glue or conductive ink. The conductive glue may be composed primarily of resin matrix, conductive particles, a dispersing agent, and an additive. The conductive ink is composed of silver nanoparticles having a diameter less than 0.1 micrometer dissolved in a special solvent containing polymer latex. The conductive ink becomes electrically conductive after being dried. It should be understood that, depending on a viscosity of the conductive glue or the conductive ink, an air pressure of the circuit printing devices 231, 233 is adjusted to adjust a thickness of a circuit printed on the circuit board A. In addition, color may be added to the conductive glue or to the conductive ink so that the circuit can be seen clearly. After the circuit is printed by the circuit printing devices 231, 233, the circuit board A is processed through the first insulating adhesive brush 241 and the second insulating adhesive brush 243. When the circuit board A is a one-sided circuit board, the second circuit printing device 233 and the second insulating adhesive brush 243 are omitted. When the circuit board A is a double-sided circuit board, the circuit board A is processed through the first insulating adhesive brush 241 and the second insulating adhesive brush 243 after the first circuit printing device 231 and the second circuit printing device 233 print the circuit. The first insulating adhesive brush 241 and the second insulating adhesive brush 243 apply an insulating adhesive on the upper surface and lower surface of the circuit board A.

Figure 6:
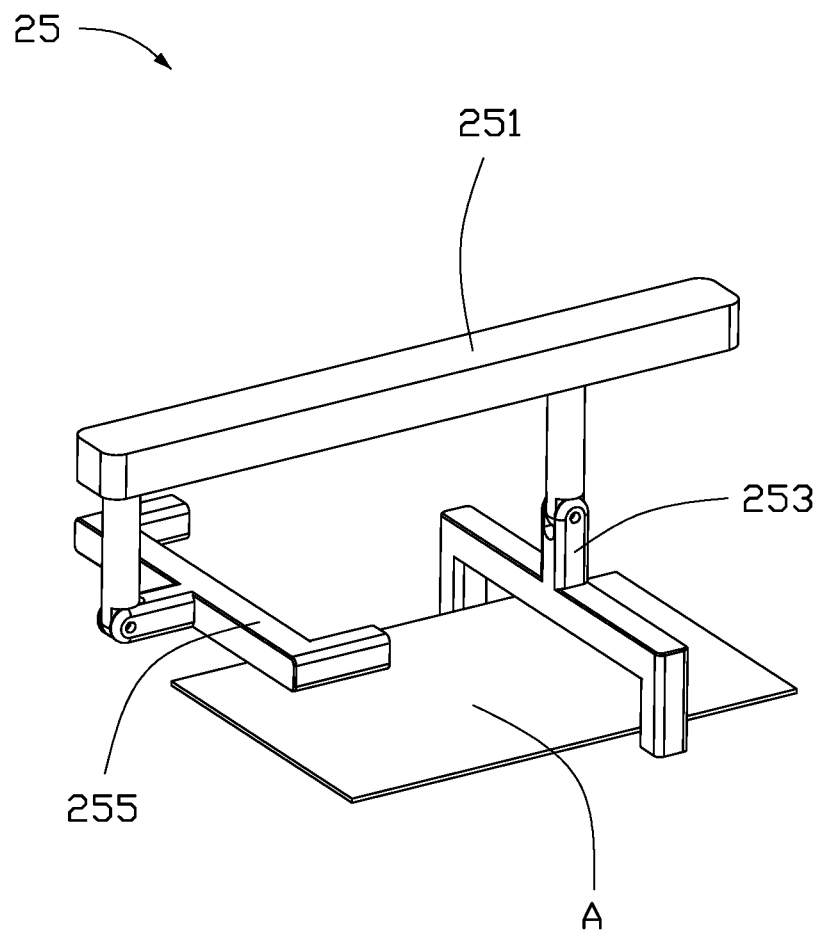
FIG. 6 is a view of a flipping device of the vertical circuit board printer in FIG. 3.

Referring to FIG. 6, when the circuit board A is a double-sided circuit board, the circuit board A needs to be flipped over to print the circuit on the lower surface of the circuit board A. The flipping device 25 clamps the circuit board A and rotates the circuit board A 180 degrees to flip the lower surface of the circuit board A upward. In detail, the flipping device 25 includes a fixing rod 251, a first clamper 253, and a second clamper 255. The first clamper 253 and the second clamper 255 are fixed to corresponding two ends of the fixing rod 251. When the circuit board A is positioned below the first clamper 253 (the upper surface of the circuit board A faces upward), the first clamper 253 clamps the circuit board A and rotates 90 degrees, so that the lower surface of the circuit board A faces the second clamper 255. Then, the second clamper 255 clamps the circuit board A and rotates 90 degrees, so that the lower surface of the circuit board A faces upward, and places the flipped circuit board A onto the corresponding tray 40. Finally, after the remaining printing devices of the printer assembly 20 finish processing the circuit board A, the circuit board A is moved to the adjacent lower front conveyor 12 or moved to the rear conveyor 14 (shown in FIG. 1) for the remaining printing devices of the printer assembly 20 to process the circuit board A.

Figure 7:
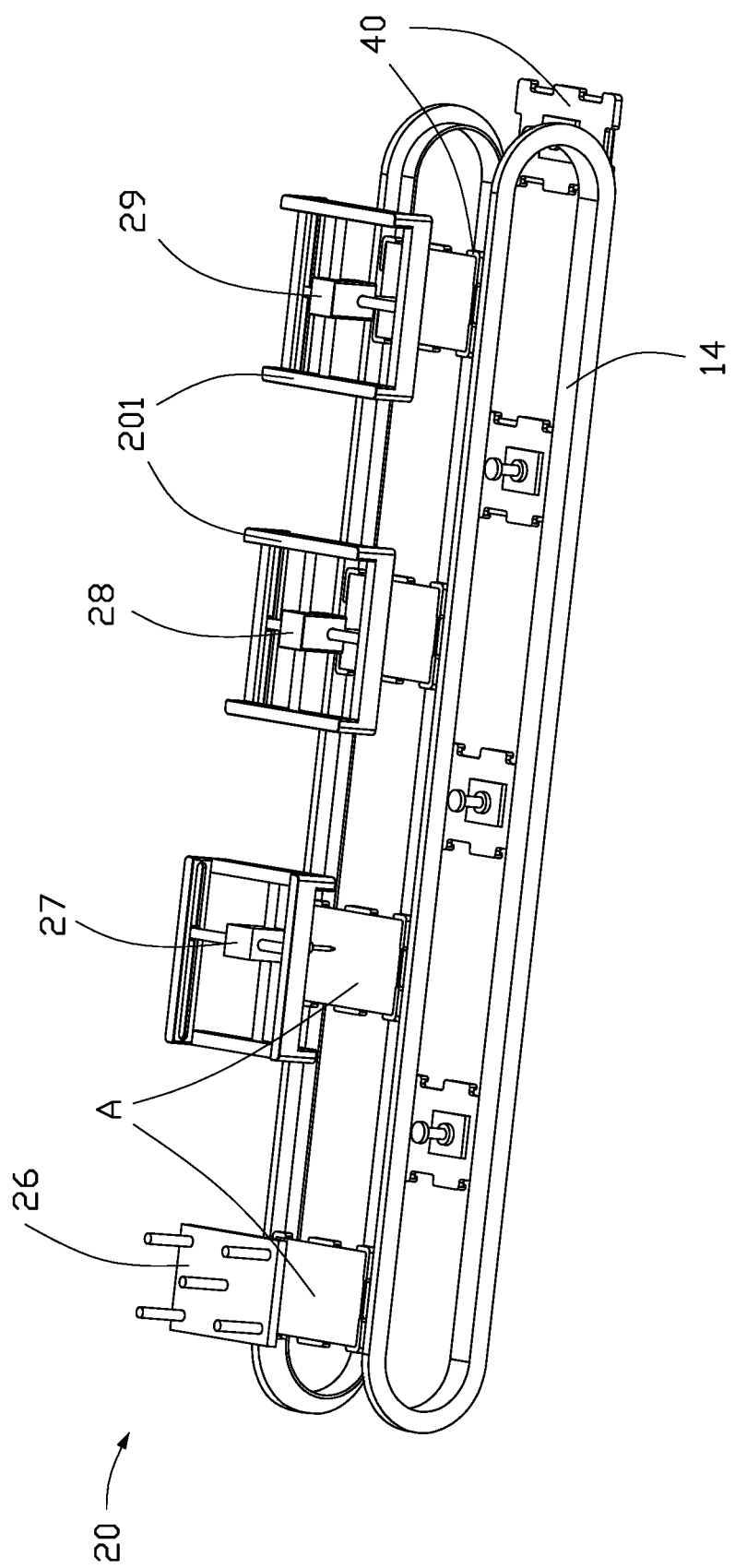
FIG. 7 is a view of a rear conveyor of the vertical circuit board printer in FIG. 1.

Referring to FIG. 7, the rear conveyor 14 is substantially similar to the front conveyor 12. The difference is the printing devices of the printer assembly 20 above the rear conveyor 14. The printing devices above the rear conveyor 14 include in sequence, from an and of the rear conveyor 14 adjacent to the front conveyor 12 to an opposite end of the rear conveyor 14, a laminator 26, a green solder mask printing device 27, a white text and mark printing device 28, and a tin printing device 29. The laminator 26 laminates the upper surface and the lower surface of the circuit board A. Of course, if the circuit board A is a one-sided circuit board, then the laminator 26 is not needed. The green solder mask printing device 27 prints a green solder mask layer on the circuit board A. A material of the green solder mask printing device 27 may be insulating green oil, insulating black oil, or the like. The white text and mark printing device 28 prints text and a mark on the circuit board A. A material of the white text and mark printing device 28 may be insulating white oil or the like. The tin printing device 29 prints tin onto the circuit board A to provide a solder interface for an electronic component. A material of the tin printing device 29 is tin. In at least one embodiment, the green solder mask printing device 27, the white text and mark printing device 28, and the tin printing device 29 are fixed to the guiding device 201, and the guiding device 201 is controlled by the control system 30 to move along an X-axis and Y-axis in a horizontal plane during operation of the printing devices of the printer assembly 20 above the rear conveyor 14. An output device (not shown) may be located next to the tin printing device 29 for outputting the finished printed circuit board A. Operation of the printing devices of the printer assembly 20 is controlled by a software system (not shown) of the control system 30. The software system automatically converts .PCB, .PWK, .DXF, and other file types into GERBER 2-D vector image files, and sends the converted files to the corresponding printing devices. These software types are designed by PAD2000, POWERPCB, PROTEL, CLIENT98, or the like. A driving program can directly and automatically analyze GERBER 2-D vector image files from circuit image files made by image drafting software such as PROTEL or POWERPCB, and generate a print menu including serial numbers of the GERBER 2-D vector image files for the printing devices of the printer assembly 20.

Figure 8:
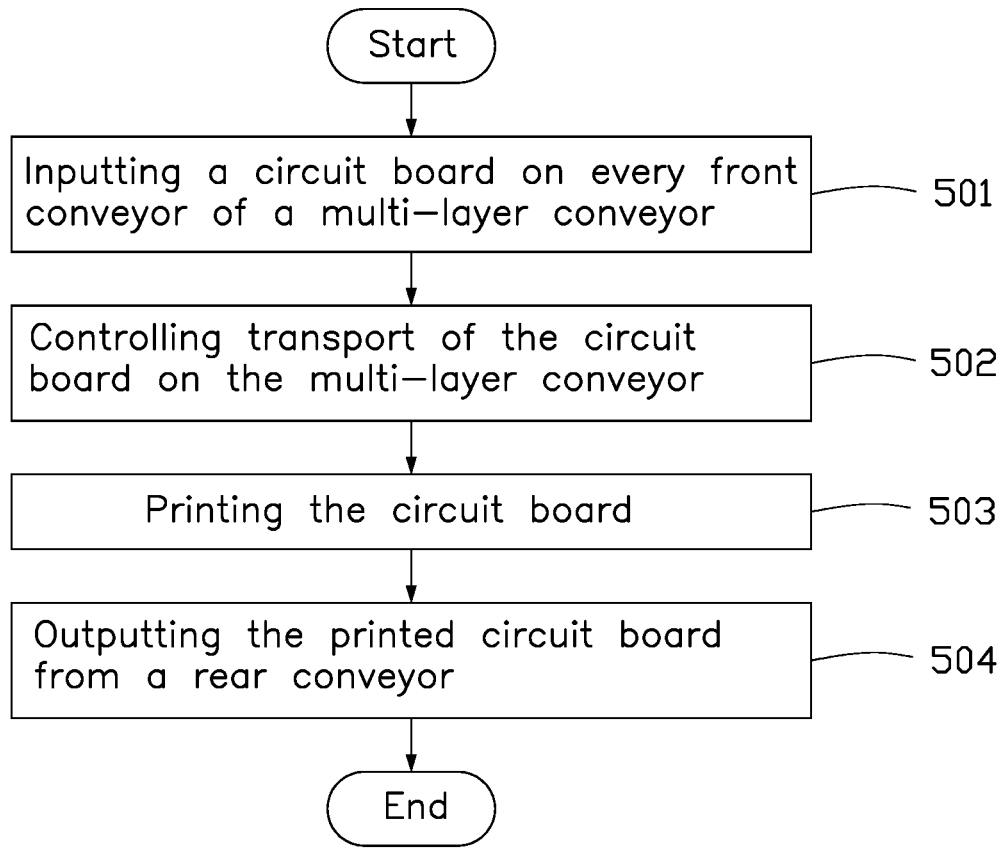
FIG. 8 is a flowchart view of a method for vertically printing a circuit board.

FIG. 8 illustrates a flowchart of an exemplary method for vertically printing a circuit board. The example method is provided by way of example, as there are a variety of ways to carry out the method. The method described below can be carried out using the configurations illustrated in FIGS. 1-7, for example, and various elements of these figures are referenced in explaining the example method. Each block shown in FIG. 8 represents one or more processes, methods, or subroutines carried out in the example method. Furthermore, the illustrated order of blocks is by example only, and the order of the blocks can be changed. Additional blocks can be added or fewer blocks can be utilized, without departing from this disclosure. The example method can begin at block 501.

At block 501, a circuit board is input on every front conveyor of a multi-layer conveyor.

At block 502, transport of the circuit board on the multi-layer conveyor is controlled by sensors of a control system.

At block 503, the circuit board is printed on by a printer assembly controlled by a software system of the control system.

At block 504, the printed circuit board is output from a rear conveyor coupled to the front conveyors.

Figure 9:
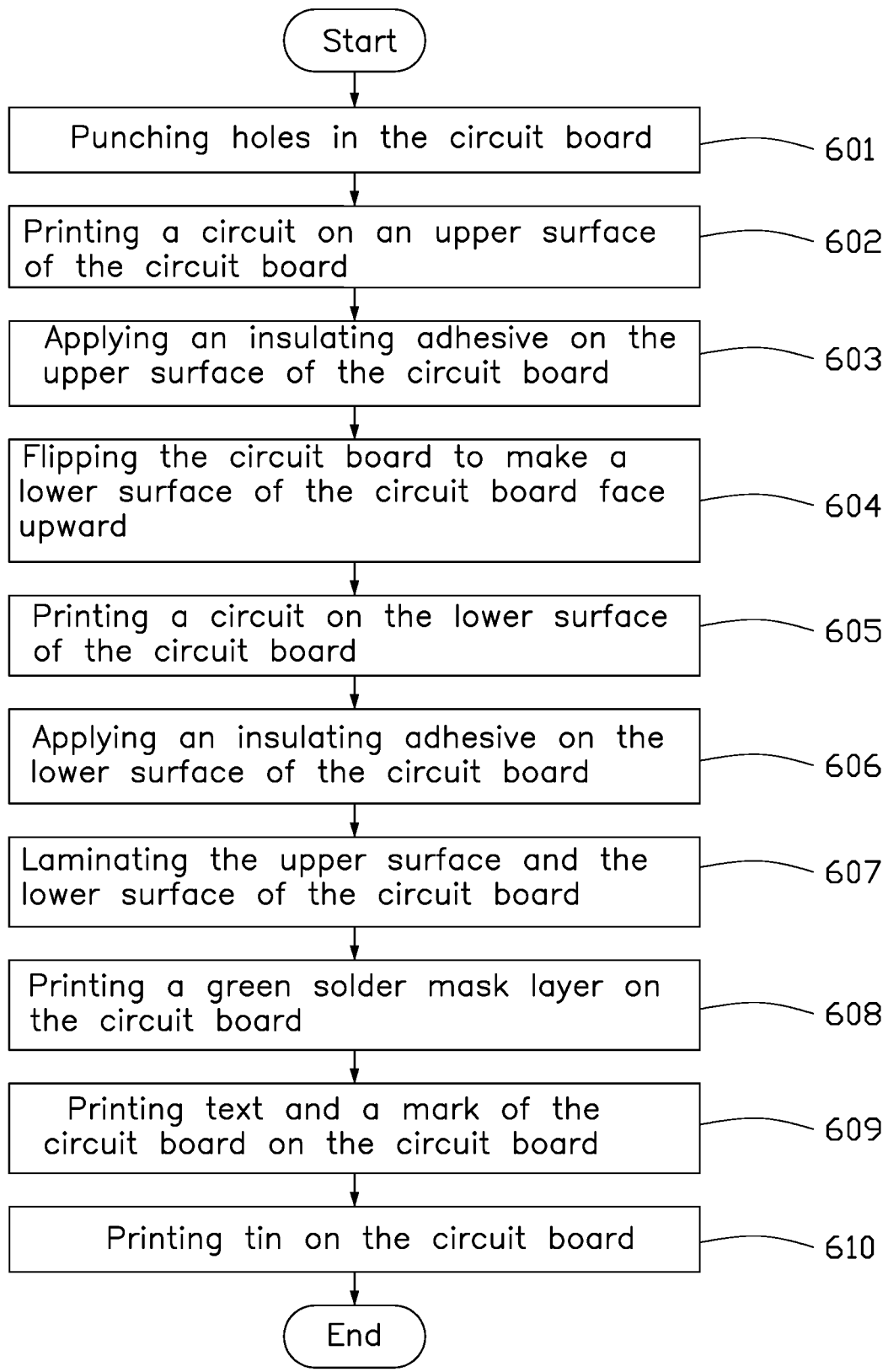
FIG. 9 is a flowchart view of a method for printing a double-sided circuit board of the method in FIG. 8.

FIG. 9 illustrates a flowchart of an exemplary method for printing a double-sided circuit board at block 503. The example method is provided by way of example, as there are a variety of ways to carry out the method. The method described below can be carried out using the configurations illustrated in FIGS. 1-7, for example, and various elements of these figures are referenced in explaining the example method. Each block shown in FIG. 9 represents one or more processes, methods, or subroutines carried out in the example method. Furthermore, the illustrated order of blocks is by example only, and the order of the blocks can be changed. Additional blocks can be added or fewer blocks can be utilized, without departing from this disclosure. The example method can begin at block 601.

At block 601, holes are punched in the circuit board by a punching device.

At block 602, a circuit is printed on an upper surface of the circuit board by a first circuit printing device.

At block 603, an insulating adhesive is applied on the upper surface of the circuit board by a first insulating adhesive brush.

At block 604, the circuit board is flipped by a flipping device to make a lower surface of the circuit board face upward.

At block 605, a circuit is printed on the lower surface of the circuit board by a second circuit printing device.

At block 606, an insulating adhesive is applied on the lower surface of the circuit board by a second insulating adhesive brush.

At block 607, the upper surface and the lower surface of the circuit board are laminated by a laminator.

At block 608, a green solder mask layer is printed on the circuit board by a green solder mask printing device.

At block 609, text and a mark of the circuit board are printed on the circuit board by a white text and mark printing device.

At block 610, tin on the circuit board is printed on the circuit board by a tin printing device.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:
1. A vertical circuit board printer comprising:
a multi-layer conveyor comprising a plurality of front conveyors in a stacked arrangement in a vertical direction and one rear conveyor, the front conveyors and rear conveyor are configured to convey a plurality of circuit boards, each upper front conveyor is coupled to a lower front conveyor by a circuit board-lowering mechanism configured to transport the plurality of circuit boards in sequence from the plurality of front conveyors to the rear conveyor;
a printer assembly comprising a plurality of printers arranged in sequence above each of the plurality of front conveyors wherein the printers are configured to print a circuit on a surface of the plurality of circuit boards; and a control system controlling operation of the multi-layer conveyor and controlling operation of the printing assembly through a software system.

2. The vertical circuit board printer of claim 1, wherein a plurality of trays are equally spaced apart on the plurality of front conveyors; the trays are controlled by the control system to move cyclically on the front conveyors and carry the circuit boards, hold or release the boards, and position the tray opposite to the corresponding printers of the printing assembly.

3. The vertical circuit board printer of claim 1, wherein the plurality of front conveyors in the stacked arrangement are supported by load-bearing brackets; a bottom side of the front conveyors is coupled to the rear conveyor; a quantity of the front conveyors and width of the front conveyors and rear conveyor are adjusted according to a requirement of printing the circuit boards.

4. The vertical circuit board printer of claim 1, wherein the circuit board-lowering mechanism is a vertical mechanism configured to vertically lower the circuit boards from the upper front conveyor to the lower front conveyor.

5. The vertical circuit board printer of claim 4, wherein the circuit board-lowering mechanism is a conveyor belt located between adjacent upper and lower front conveyors; the circuit boards are transported from the upper front conveyor to the lower front conveyor through the conveyor belt.

6. The vertical circuit board printer of claim 1, wherein each of the printers of the printer assembly located above the front conveyors comprise in sequence, from an end of the front conveyors away from the rear conveyor to the rear conveyor, a feeding device, a punching device, at least one circuit printing device, at least one insulating adhesive brush, and a flipping device; the punching device and the circuit printing device are fixed on a guiding device; the guiding device is movably horizontally along an X-axis and a Y-axis to move the punching device and the circuit printing device.

7. The vertical circuit board printer of claim 6, wherein the feeding device comprises a feeding box and a plurality of gears; a top and bottom side of the feeding box are open; the plurality of gears are located on side surfaces of the feeding box; the circuit boards are supported by teeth grooves of the gears; the plurality of gears are arranged in two gear groups; each gear group is made up of two gears synchronously coupled together; the two gear groups are located on corresponding opposite sidewalls of the feeding box; each gear group is located on a corresponding standard scale guide rail, so that the two gear groups are positioned at a same height; the two gear groups support the circuit boards in a horizontal plane within the feeding box.

8. The vertical circuit board printer of claim 6, wherein the punching device uses a laser drill and a mechanical drill; the mechanical drill comprises a plurality of drills of different diameters.

9. The vertical circuit board printer of claim 6, wherein a printing head of the circuit printing device is made up of a plurality of print nozzles having different diameters.

10. The vertical circuit board printer of claim 6, wherein the flipping device comprises a fixing rod, a first clamper, and a second clamper; the first clamper clamps the circuit boards downward and rotates the circuit boards 90 degrees; the second clamper clamps the circuit boards and rotates the circuit boards 90 degrees to flip over the circuit boards.

11. The vertical circuit board printer of claim 6, wherein a printer assembly above the rear conveyor comprises in sequence, from an end of the rear conveyor adjacent to the front conveyors to an opposite end of the rear conveyor, a laminator, a green solder mask printing device, a white text and mark printing device, and a tin printing device; the laminator laminates a top side of one of the circuit boards to a bottom side of another of the circuit boards; the green solder mask printing device, the white text and mark printing device, and the tin printing device are fixed on a guiding device.

* * * * *